(12) United States Patent
Tae

(10) Patent No.: US 11,708,635 B2
(45) Date of Patent: Jul. 25, 2023

(54) PROCESSING CHAMBER CONDITION AND PROCESS STATE MONITORING USING OPTICAL REFLECTOR ATTACHED TO PROCESSING CHAMBER LINER

(71) Applicant: Applied Materials, Inc., Santa Clara, CA (US)

(72) Inventor: Patrick Tae, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 314 days.

(21) Appl. No.: 16/946,264

(22) Filed: Jun. 12, 2020

(65) Prior Publication Data

US 2021/0388494 A1 Dec. 16, 2021

(51) Int. Cl.
*H01L 21/67* (2006.01)
*H01J 37/32* (2006.01)
*C23C 16/44* (2006.01)
*G01N 21/55* (2014.01)
*C23C 16/455* (2006.01)

(52) U.S. Cl.
CPC .... *C23C 16/4405* (2013.01); *C23C 16/45536* (2013.01); *G01N 21/55* (2013.01); *H01J 37/32862* (2013.01); *H01J 37/32972* (2013.01); *H01L 21/67017* (2013.01)

(58) Field of Classification Search
CPC ...................... H01J 37/32862; H01J 37/32972
See application file for complete search history.

(56) References Cited

U.S. PATENT DOCUMENTS

| 4,594,226 | A | 6/1986 | Reedy |
| 6,025,916 | A | 2/2000 | Quick et al. |
| 7,578,301 | B2 | 8/2009 | Hudson et al. |
| 7,591,923 | B2 | 9/2009 | Mitrovic et al. |
| 8,009,288 | B2 | 8/2011 | Berlin et al. |
| 8,144,328 | B2 | 3/2012 | Venugopal et al. |
| 8,513,002 | B2 | 8/2013 | Berlin et al. |
| 9,347,132 | B2 | 5/2016 | Ramachandran et al. |
| 10,008,370 | B2 | 6/2018 | Ohmori et al. |

(Continued)

FOREIGN PATENT DOCUMENTS

| KR | 10-20110127389 | 11/2011 |
| KR | 10-2025873 | 9/2019 |

(Continued)

OTHER PUBLICATIONS

PCT Notification of Transmittal of the International Search Report and the Written Opinion of the International Searching Authority for PCT Application No. PCT/US2021/037108, dated Oct. 5, 2021, 9 pages.

*Primary Examiner* — Joseph L Williams

(74) *Attorney, Agent, or Firm* — Lowenstein Sandler LLP

(57) ABSTRACT

A system includes a reflector attached to a liner of a processing chamber. A light coupling device is to transmit light, from a light source, through a window of the processing chamber directed at the reflector. The light coupling device focuses, into a spectrometer, light received reflected back from the reflector along an optical path through the processing chamber and the window. The spectrometer detects, within the focused light, a first spectrum representative of a deposited film layer on the reflector using reflectometry. An alignment device aligns, in two dimensions, the light coupling device with the reflector until maximization of the focused light received by the light coupling device.

16 Claims, 8 Drawing Sheets

(56) References Cited

U.S. PATENT DOCUMENTS

| | | |
|---|---|---|
| 10,269,545 B2 | 4/2019 | Gottscho |
| 10,615,009 B2 | 4/2020 | Guha et al. |
| 10,796,891 B2 | 10/2020 | Kim et al. |
| 11,114,286 B2 | 9/2021 | Lin et al. |
| 11,276,564 B2 | 3/2022 | Gottscho |
| 11,499,869 B2 | 11/2022 | Lin et al. |
| 2005/0127192 A1 | 6/2005 | Kang et al. |
| 2015/0214016 A1 | 6/2015 | Ham et al. |
| 2018/0164215 A1 | 6/2018 | Glacer et al. |
| 2020/0013558 A1 | 1/2020 | Lian et al. |
| 2020/0303169 A1 | 9/2020 | Sakai |
| 2021/0391157 A1 | 12/2021 | Tae et al. |

FOREIGN PATENT DOCUMENTS

| | | |
|---|---|---|
| WO | 2020142451 A1 | 7/2020 |
| WO | 2021061541 A1 | 4/2021 |

```
500A
```

Collimate and transmit, by a first light coupling device, light emitted from a light source through a first window of a processing chamber directed along a first optical path onto a reflector (mounted on a liner of the processing chamber across from the first window) at an oblique angle. 510

Align, by a first alignment device, the first light coupling device in two dimensions with reference to the reflector along the first optical path until maximization of the reflected light received by the second collimator. 515

Align, by a second alignment device, the second collimator in the two dimensions with reference to the reflector along a second optical path until maximization of the reflected light received by the second collimator. 520

Align, by a third alignment device, the reflector in concert with the first alignment device aligning the first collimator with the reflector and with the second alignment device aligning the second collimator with the reflector. 525

Focus, by a second light coupling device into a fiber optic cable, light received reflected back from the reflector along the second optical path through a second window of the processing chamber. 530

Receive, by the spectrometer, the focused light from the fiber optic cable. 535

Detect, by the spectrometer within the focused light, a first spectrum representative of a deposited film layer on the reflector. 540

FIG. 5A

PROCESSING CHAMBER CONDITION AND PROCESS STATE MONITORING USING OPTICAL REFLECTOR ATTACHED TO PROCESSING CHAMBER LINER

TECHNICAL FIELD

Embodiments of the present disclosure relate to monitoring processing chamber condition and process state using an optical reflector attached to a processing chamber liner.

BACKGROUND

Changes to the surfaces of a processing chamber impacts various processing parameters. For example, re-deposition of etching byproducts on the chamber wall may alter the etching rate of a given process. Accordingly, as substrates are processed in the chamber, the etching rate (or other process parameters or states) may change and result in non-uniform processing between substrates.

There is currently no reliable method for monitoring surface condition within a processing chamber, including surfaces of a liner (or inside wall), lid, electrostatic chuck (ESC), process ring, and the like. For example, the chemical, physical, and thermal condition of the liner of a processing chamber is known to impact plasma processes by affecting the recombination of outgassing near the liner. Several monitoring methods, such as capacitive or resonant frequency monitoring, are in development but these methods suffer from thermal or radio frequency noise, particularly during processing.

Further, substrate processing is subject to inefficiencies and/or inaccuracies due to a lack of in-processing information, particularly as processing equipment ages. For example, after process shift in a processing chamber over time, processing can sometimes result in a change in deposition amount (e.g., deposition thickness) or a change in composition of the deposition, both of which may lead to unacceptable batches of processed substrates that have to be scrapped. Further, knowing when to run a cleaning process within the processing chamber can be guesswork (e.g., based on only in-process hours), and running the cleaning process too often can impact substrate throughput. Other processing inefficiencies or inaccuracies exist and will be discussed in more detail.

SUMMARY

Some of the embodiments described herein cover a processing system including a reflector attached to a liner of a processing chamber. The system may further include a light coupling device to transmit light, from a light source, through a window of the processing chamber directed at the reflector. The light coupling device may further collimate reflected light received back from the reflector along an optical path through the processing chamber and the window, to generate collimated light. The light coupling device may further direct the collimated light to a spectrometer, which is to detect a first spectrum representative of a deposited film layer on the reflector using reflectometry. The system may further include an alignment device coupled to the light coupling device, the alignment device to align, in two dimensions, the light coupling device with the reflector until maximization of the reflected light received by the light coupling device.

In some embodiments, a related method includes transmitting, by a light coupling device, light emitted from a light source through a window of a processing chamber directed at a reflector mounted on a liner of the processing chamber across from the window. The method may further include focusing, by the light coupling device into a fiber optic cable, light received reflected back from the reflector along an optical path through the processing chamber and the window. The method may further include receiving, by a spectrometer, the focused light from the fiber optic cable. The method may further include detecting, by the spectrometer within the focused light, a first spectrum representative of a deposited film layer on the reflector. The method may further include aligning, by a first alignment device, the light coupling device in two dimensions with reference to the reflector along the optical path until maximization of the light received by the light coupling device.

In additional or related embodiments, another processing system includes a reflector attached to a liner of a processing chamber and a light source to emit light. The system may further include a first collimator coupled to the light source and positioned to collimate and direct the light through a first window of the processing chamber onto the reflector at an oblique angle. The system may further include a spectrometer. The system may further include a second collimator positioned adjacent a second window on a side of the processing chamber across from the first window, where the second collimator is to focus light received from the reflector into a fiber optic cable. The spectrometer is to receive the focused light from the fiber optic cable and detect, within the focused light, a first spectrum representative of a deposited film layer on the reflector. The system may further include a first alignment device coupled to the first collimator, the first alignment device to align, in two dimensions, the first collimator with the reflector until maximization of the light received by the second collimator.

Numerous other features are provided in accordance with these and other aspects of the disclosure. Other features and aspects of the present disclosure will become more fully apparent from the following detailed description, the claims, and the accompanying drawings.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 5A is a flow chart of a method for measuring a first spectrum of a deposited thin film on a reflector attached to a liner of a processing chamber, according to another aspect of the disclosure.

DETAILED DESCRIPTION OF EMBODIMENTS

Figure 1:
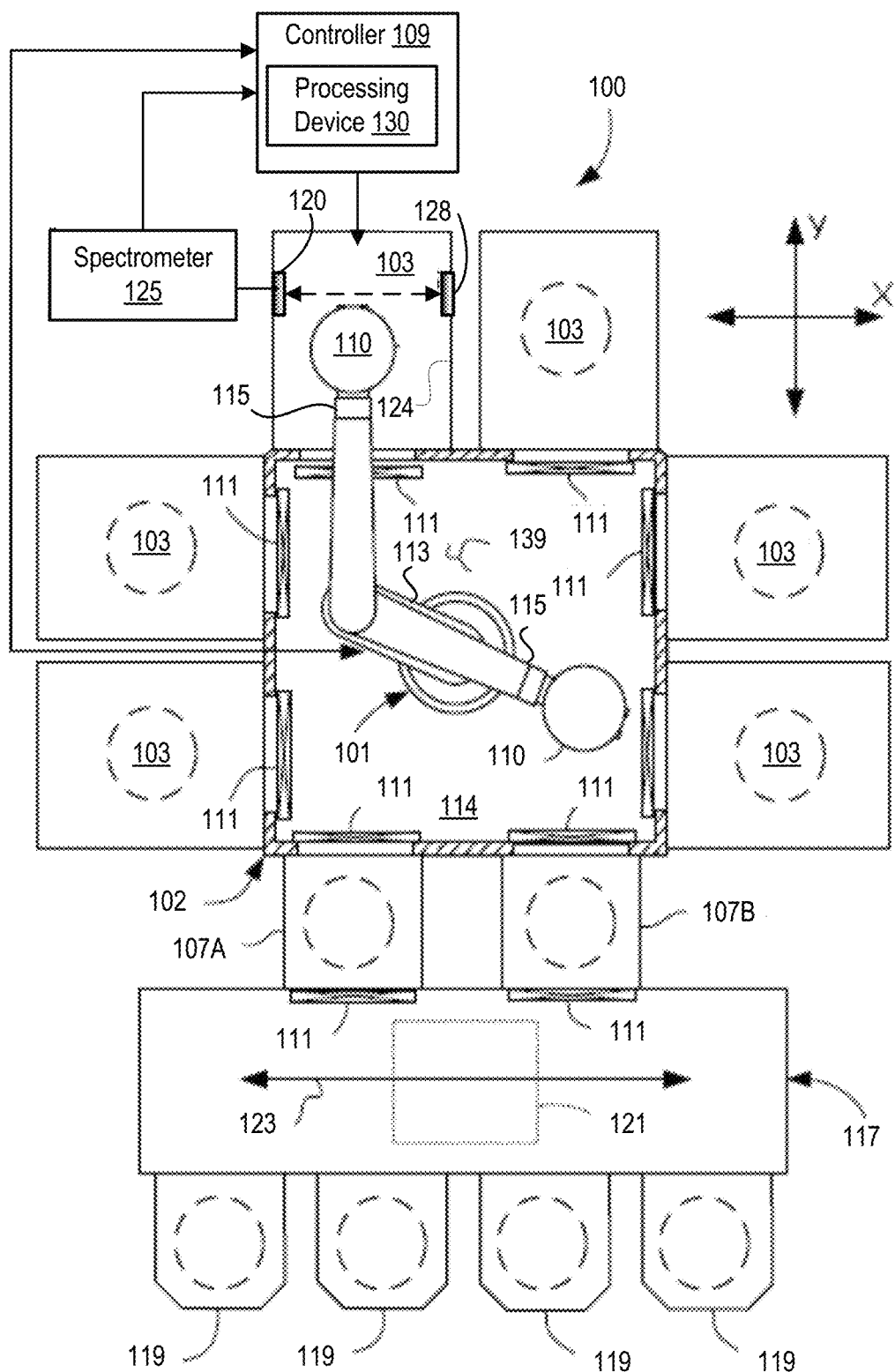
FIG. 1 is a top schematic view of an example processing system, according to one aspect of the disclosure.

Embodiments described herein are related to systems and methods for use of interferometric reflectometry or ellipsometry with reference to a liner (or inner wall) of the processing chamber to monitor a condition and/or process state of the processing chamber. Reflectometry and ellipsometry, for example, may be used to determine a thickness and a composition of a deposited film layer on a reflector attached to the liner of the processing chamber. Determining the process state of the processing chamber may occur during processing of substrates within the processing chamber, and thus can involve adapting for the presence of plasma in the processing chamber, e.g., which includes corrosive gases used for etching the substrates.

In various embodiments, determining the condition of the liner of the processing chamber may be indicative of the condition of the processing chamber generally, including whether there has been a process shift (or drift) for which correction should be taken, e.g., calibration, cleaning, or replacement of processing equipment. Such process shift may impact performance and yield of processed substrates. Further, determining a thickness of deposited film layers may be commensurate with deposited thin films on substrates being processed (if measured during processing), and thus may be used to confirm proper deposition rates, amounts, and when and how much to clean a processing chamber after processing. Further advantages include being able to perform reflectometry or ellipsometry in a way that involves minimal disruption to the plasma volume during substrate processing, and reducing hardware-induced skew and particle risks. The present embodiments may also involve minimal modification to existing liner designs.

More specifically, disclosed systems and methods include a light source (e.g., broadband light source), a spectrometer (or other apparatus for recording and measuring spectra as a method of analysis), and a light coupling device such as a collimator or mirror. The systems and methods may further include a reflector attached to or integrated within a liner of the processing chamber.

In various embodiments, the light coupling device may be designed to collimate and transmit light, from the light source, through a window of the processing chamber and onto the reflector. The light coupling device may also focus, into a spectrometer (or a fiber optic cable coupled to the spectrometer), light reflected received back from the reflector along an optical path through the processing chamber and the window. The spectrometer may then detect a first spectrum representative of a deposited film layer on the reflector.

In another embodiment, there are two light coupling devices (e.g., two collimators or two mirrors) and two windows within the processing chamber. A first collimator may be coupled to the light source and positioned to collimate and direct the light through a first window of the processing chamber onto the reflector at an oblique angle. A second collimator may be positioned adjacent the second window on a side of the processing chamber across from the first window. The second collimator may focus, into a spectrometer (or a fiber optic cable coupled to the spectrometer), light received from the reflector. The spectrometer may then detect a first spectrum representative of a deposited film layer on the reflector.

In some embodiments, the system and methods include a controller (e.g., a processing device) that is coupled to the spectrometer. The processing device may direct the light source to turn on, and then receive the first spectrum from the spectrometer. The processing device may also direct the light source to turn off and receive a second spectrum from the spectrometer when the light source is turned off. This second spectrum corresponds to the optical emission spectroscopy (OES) of the plasma at that moment and can be removed from the first spectrum to result in a reflectometry signal capable of being processed.

For example, the processing device may be adapted to receive the first spectrum and the second spectrum, and calculate reflectometry data by subtracting the second spectrum from the first spectrum. The processing device may then calculate a reflectometry signal by dividing the reflectometry data by a reference spectrum. (A similar approach will be discussed measuring the spectrums using ellipsometry in the alternative embodiment.) The processing device may then fit the reflectometry signal to a thin film optical model to determine information that includes one or more optical thin film property of the process film layer. Such optical thin film properties include, but are not limited to, thickness, values of refractive index (n) and extinction coefficient (k) values, and a composition material, as will be discussed in detail. In some embodiments, assumptions about the plasma used, expected deposition thickness, estimated prior film accumulations, and the like may be made in order to fit data of the reflectometry signal to the thin film model to determine the composition material of the process film layer. The one or more optical thin film property may in turn inform determination of certain endpoints associated with processes performed within the processing chamber, including, but not limited to, whether to adjust a rate of deposition, when to stop deposition of a chemical or plasma, when to start cleaning the processing chamber, when to stop cleaning the processing chamber, and an amount process drift or spent chamber life.

In an embodiment, for example, the processing device (or controller) compares the thickness of the deposited film layer on the reflector with a baseline measurement, e.g., taken when the processing chamber was first put into operation. If this value varies beyond a threshold variation (e.g., for thickness of the process film layer), the processing device may trigger a process within the processing chamber that is to correct the rate of deposition of the process film layer. The processing device may also alter a process to restore a process state or may alert a user of the processing chamber of a process shift, among other actions that will be discussed.

Because the spectrometer is taking spectra measurements of light that sometimes passes through plasma present during processing, the present disclosure seeks to increase the signal-to-noise ratio (SNR) of the focused light that is to be measured by the spectrometer. The SNR may be improved in a variety of ways. For example, a first alignment device may be coupled to the light coupling device to align the light coupling device in two dimensions with respect to the reflector until maximization of the light received by the light coupling device. An optional second alignment device may be coupled to the second collimator to align, in two dimensions, the second collimator with reference to the reflector until the maximization of the light received by the second collimator. An optional third alignment device may be coupled to the reflector to align the reflector in concert with the first alignment device aligning the light source with the reflector (and optionally in concert with the second alignment device aligning the second collimator with the reflector). Further, the controller may be coupled to any or a combination of the alignment device(s), the controller to calibrate and/or to control the alignment device(s) in order to increase the SNR of the received light above a threshold SNR.

In various embodiments, the reflector may also improve the SNR of the reflected light and measuring accuracy of the spectrometer. For example, when positioned adjacent to or near the liner as a separate structure, the reflector may enable greater control of the film stack created on the reflector. For example, the film stack may be engineered for desired optical and/or chemical properties. The desired optical properties include a film stack that can produce clearly visible interferometric fringes when a new film is deposited on top of the film stack. This may enhance the detection sensitivity, and thus improve the SNR. The desired chemical properties of the film stack may include, for example, high chemical resistance to the process chemistries that minimize physical or chemical change to the reflector in order to maximize lifetime of the reflector. Further, the chemical properties should mirror the chemical properties of the liner material in order to ensure that deposition on the reflector mimics the deposition on the liner as much as possible.

The reflector may further be manufactured and/or polished to have a surface roughness (Ra) of no more than two microinches. Such a highly polished (or smooth) surface may enable not only a better SNR of the reflected light, but also enable true thin film interferometric operations by enabling highly precise measurements (e.g., to the sub-angstrom level) of thin films accumulated on the reflector during processing. For example, the spectrometer in each embodiment may calculate deposited film thickness as well as the refractive index (n) and extinction coefficient (k) values, which may be used to determine a composition of the deposited film layer as will be discussed.

FIG. 1 is a top schematic view of an example processing system 100, according to one aspect of the disclosure. The processing system 100 includes a transfer chamber robot 101 and a factory interface robot 121 each adapted to pick and place substrates 110 (sometimes referred to as "wafers" or "semiconductor wafers") from or to a destination in an electronic device processing system such as the processing system 100 illustrated in FIG. 1. However, any type of electronic device substrate, mask, or other silica-containing substrate (generally referred to as "substrates" herein) may be conveyed and transferred by the disclosed robots. For example, the destination for the substrates 110 may be one or more processing chambers 103 and/or one or more of the load lock apparatus 107A, 107B that may be distributed about and coupled to a transfer chamber 114. As shown, substrate transfers may be through slit valves 111, for example.

The processing system 100 may further include a mainframe 102 including the transfer chamber 114 and at least two processing chambers 103. A housing of the mainframe 102 includes the transfer chamber 114 therein. The transfer chamber 114 may include top wall (not shown), bottom wall (floor) 139, and side walls, and, in some embodiments, may be maintained in a vacuum, for example. In the depicted embodiment, the transfer chamber robot 101 is mounted to the bottom wall (floor) 139. However, the transfer chamber robot 101 could be mounted elsewhere, such as to the top wall.

In various embodiments, the processing chambers 103 may be adapted to carry out any number of processes on the substrates 110. The processes may include deposition, oxidation, nitration, etching, polishing, cleaning, lithography, metrology, or the like. Other processes may be carried out as well. The load lock apparatus 107A, 107B may be adapted to interface with a factory interface 117 or other system component, that may receive substrates 110 from substrate carriers 119 (e.g., Front Opening Unified Pods (FOUPs)) that may be docked at load ports of the factory interface 117, for example. The factory interface robot 121 (shown dotted) may be used to transfer the substrates 110 between the substrate carriers 119 and each load lock apparatus 107A, 107B. Transfers of the substrates 110 may be carried out in any sequence or direction. The factory interface robot 121 may be identical (or similar) to the transfer chamber robot 101 in some embodiments, but may further include a mechanism to allow the factory interface robot to move laterally in either lateral direction and indicated by arrow 123. Any other suitable robot may be used as the factory interface robot 121.

In embodiments, and by way of exemplified explanation for any robot, the transfer chamber robot 101 includes at least one arm 113 (e.g., a robot arm) and at least one end effector 115 coupled to the arm 113. The end effector 115 is controllable by the transfer chamber robot 101 in order to pick up a substrate 110 from a load lock apparatus 107A or 107B, guide the substrate 110 through one of the slit valves 111 of a processing chamber 103, and accurately place the substrate 110 onto a substrate support of the processing chamber 103.

In various embodiments, one or more of the processing chambers 103 may include a window 120 (e.g., a vacuumed sealed window) in a side of the processing chamber 103, and which is also defined within a liner 124 (or inner wall) of the processing chamber. Each of such processing chambers may also include a reflector 128 attached to or integrated within the liner 124. In some embodiments, the reflector 128 is pivotal for alignment purposes.

In disclosed embodiments, light may be directed through the window 120 and onto the reflector 128, to generate reflected light. The reflected light may then travel back through the window 120 or through a second window, as will be discussed in more detail with reference to FIGS. 2-5. The reflected light, after exiting the processing chamber through one of the windows, may be collimated and directed to a spectrometer 125 for spectrum analysis. The spectrometer 125 may to detect a spectrum representative of a deposited film layer on the reflector 128, whether during or after substrate processing.

A controller 109 (e.g., a tool and equipment controller) may control various aspects of the processing system 100, e.g., gas pressure in the processing chamber 103, individual gas flows, spatial flow ratios, temperature of various chamber components, and radio frequency (RF) or electrical state of the processing chamber 103. The controller 109 may receive signals from and send commands to the factory interface robot 121, the transfer chamber robot 101, one or more sensors, and/or other processing components of the processing system 100. The controller 109 may thus control the initiation and cessation of processing, may adjust a deposition rate, type or mix of deposition composition, and the like. The controller 109 may further receive and process sensing data from various sensors.

In various embodiments, the controller 109 includes or is coupled to a processing device 130 to the spectrometer 125. The processing device 130 may be configured to receive and process sensing data, including first and second spectrums detected by the spectrometer 125 that are associated with the deposited film layer on the reflector 128. The processing device 130 may calculate reflectometry data by subtracting the second spectrum from the first spectrum. The processing device 130 may calculate a reflectometry signal by dividing the reflectometry data by a reference spectrum. The reference spectrum may be obtained under known conditions, such as during initial installation of the system 100. The processing device 130 may then fit the reflectometry signal to a thin film optical model to determine information that includes one or more optical thin film property of the process film layer. Depending on results of analyzing the one or more optical film property, the processing device 130 (e.g., the controller 109) may trigger the processing chamber 103 to adjust a processing parameter or setting, such as, for example, a rate of deposition, a type or mix of deposition composition, timing of performing a cleaning process within the processing chamber, and other actions that will be discussed in more detail with reference to FIG. 6.

The controller 109 and/or the processing device 130 may be and/or include a computing device such as a personal computer, a server computer, a programmable logic controller (PLC), a microcontroller, and so on. The controller 109 and/or the processing device 130 may include (or be) one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. The controller 109 and/or the processing device 130 may include a data storage device (e.g., one or more disk drives and/or solid state drives), a main memory, a static memory, a network interface, and/or other components. The controller 109 and/or the processing device 130 may execute instructions to perform any one or more of the methodologies and/or embodiments described herein. The instructions may be stored on a computer readable storage medium, which may include the main memory, static memory, secondary storage and/or processing device (during execution of the instructions).

Figure 2:
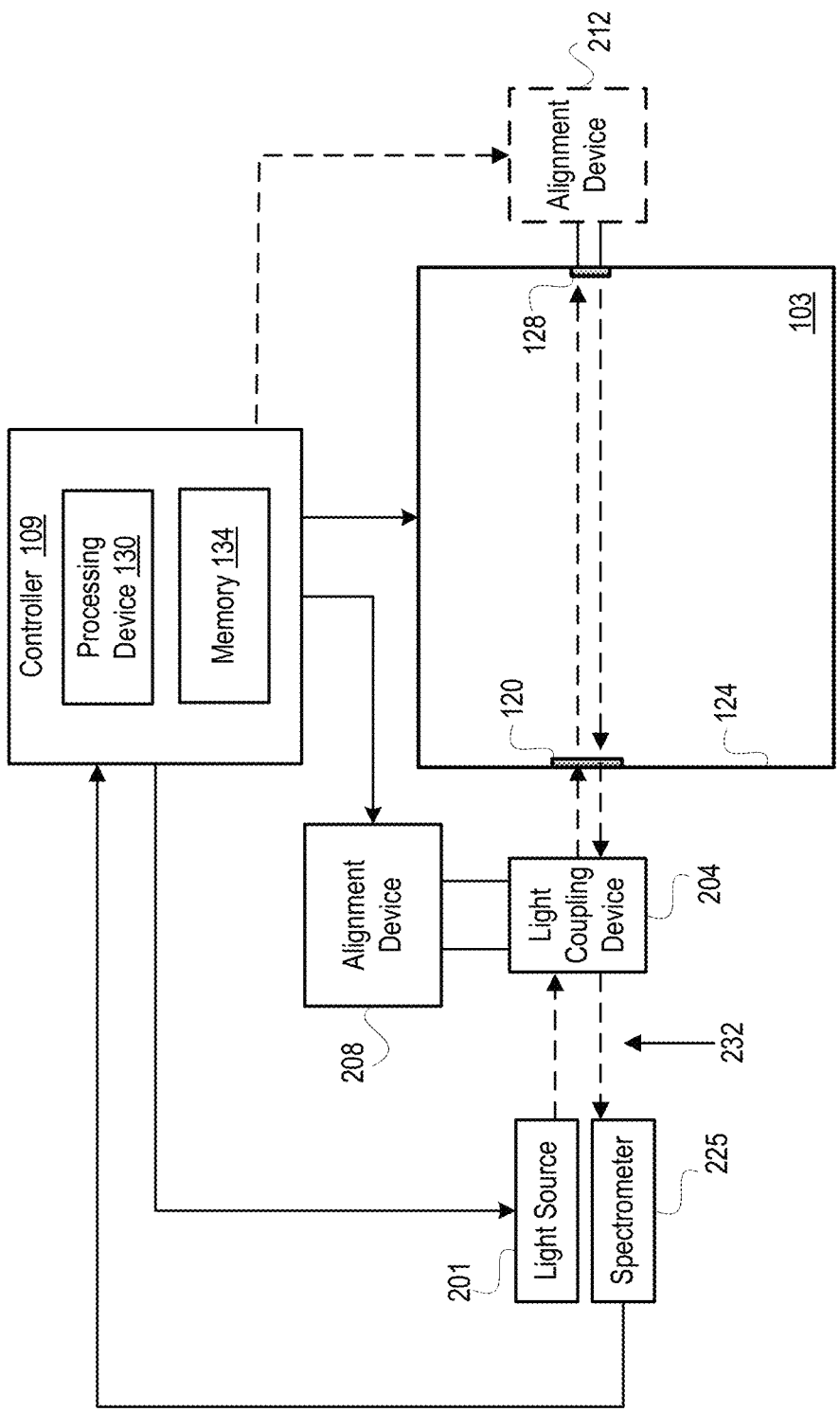
FIG. 2 illustrates a simplified side view of a system for monitoring a processing chamber, according to one aspect of the disclosure.

FIG. 2 illustrates a simplified side view of a system 200 for monitoring a processing chamber, according to one aspect of the disclosure. The system 200 may include, for example, the processing chamber 103, which has the window 120 in the liner 124, as was illustrated in FIG. 1. Furthermore, the reflector 128 may be attached to or integrated within the liner 124 across from the window 120. The system 200 may further include a light source 201 (e.g., a broadband light source or other source of electromagnetic radiation), a light coupling device 204 (e.g., a collimator or a mirror), a spectrometer 225, and the controller 109.

In various embodiments, the light coupling device 204 may be adapted to collimate and transmit light in two directions along an optical path. A first direction may include light from the light source 201 that is to be transmitted into the processing chamber 103 through the window 120. A second direction may be reflected light from the reflector 128 that passes back through the processing chamber 103 and the window 120. Further, a fiber optic cable 232 may be coupled between the spectrometer 225, the light source 201 and the light coupling device 204 for efficient transfer of light between the light source 201, to the reflector 128, and back to the spectrometer 225. The light coupling device 204 may focus the light reflected back from the reflector 128 into the spectrometer 225 (e.g., or first into the fiber optic cable coupled to the spectrometer 225) in the second direction along the optical path.

The system 200 may further include a first alignment device 208 operatively coupled to and for alignment of the light coupling device 204 and coupled to the controller 109, which includes the processing device 130. The system 200 may optionally also include a second alignment device 212 operatively coupled to and for alignment of the reflector 128 and coupled to the controller 109. Each alignment device 208 and 212 may be a gimbal, a gyroscope, a Cardan shaft, or the like for imparting two dimensional alignment (e.g., angular compensation) to the light coupling device 204 and the reflector 128, respectively. The functions of these components are described in more detail with reference to FIG. 3.

Further, the controller 109 may calibrate or control the alignment device(s) in order to increase the SNR of the collimated light above a threshold SNR. Further, the reflector 128, which may be disk-shaped in one embodiment, may be manufactured and/or polished to have a surface roughness (Ra) of no more than two microinches. Such a highly polished (or smooth) surface may enable not only a better SNR of the reflected light, but also enable true thin film interferometric operations with reference to the reflectometry and ellipsometry performed herein.

In various embodiments, the controller 109 includes or is coupled to the processing device 130 and includes or is coupled to a memory 134 or other computer storage. The controller 109 may also be coupled to the light source 201, the spectrometer 225, and the processing chamber 103. The controller 109 may direct the light source 201 to flash on and then receive the first spectrum from the spectrometer 225. The controller 109 may also keep the light source off and receive a second spectrum from the spectrometer 225 when the light source 201 is off. The second spectrum may represent the OES of the plasma or chemical process within the processing chamber. The processing device 130 may subtract the second spectrum from the first spectrum to determine the reflectometry data for a moment in time. The processing device 130 may further divide the reflectometry data by a reference spectrum to determine a reflectometry signal. The reference spectrum may be obtained under known conditions, such as during initial installation of the system 200. The dividing may normalize the spectrometry data into a spectrometry signal that is capable of analysis germane to the deposited process film layer. The processing device 130 may then mathematically fit the reflectometry signal to one or more thin film models to determine one or more optical thin film property of the process film layer that is deposited on the transparent thin film of the reflector 128.

In some embodiments, the one or more optical thin film property include deposited film thickness as well as the refractive index (n) and extinction coefficient (k) values. The refractive index is the ratio of the speed of light in a vacuum to the speed of light in the process film layer. The extinction coefficient is a measure of how much light is absorbed in the process film layer. The processing device 130 may determine, using the n and k values, a composition of the process film layer. The processing device 130 may further be configured to analyze the data of the one or more optical film property, and trigger a new process or update a current process within the processing chamber 103 based on the analysis. Such updates may include alerts and will be discussed in more detail with reference to FIG. 6.

Figure 3A:
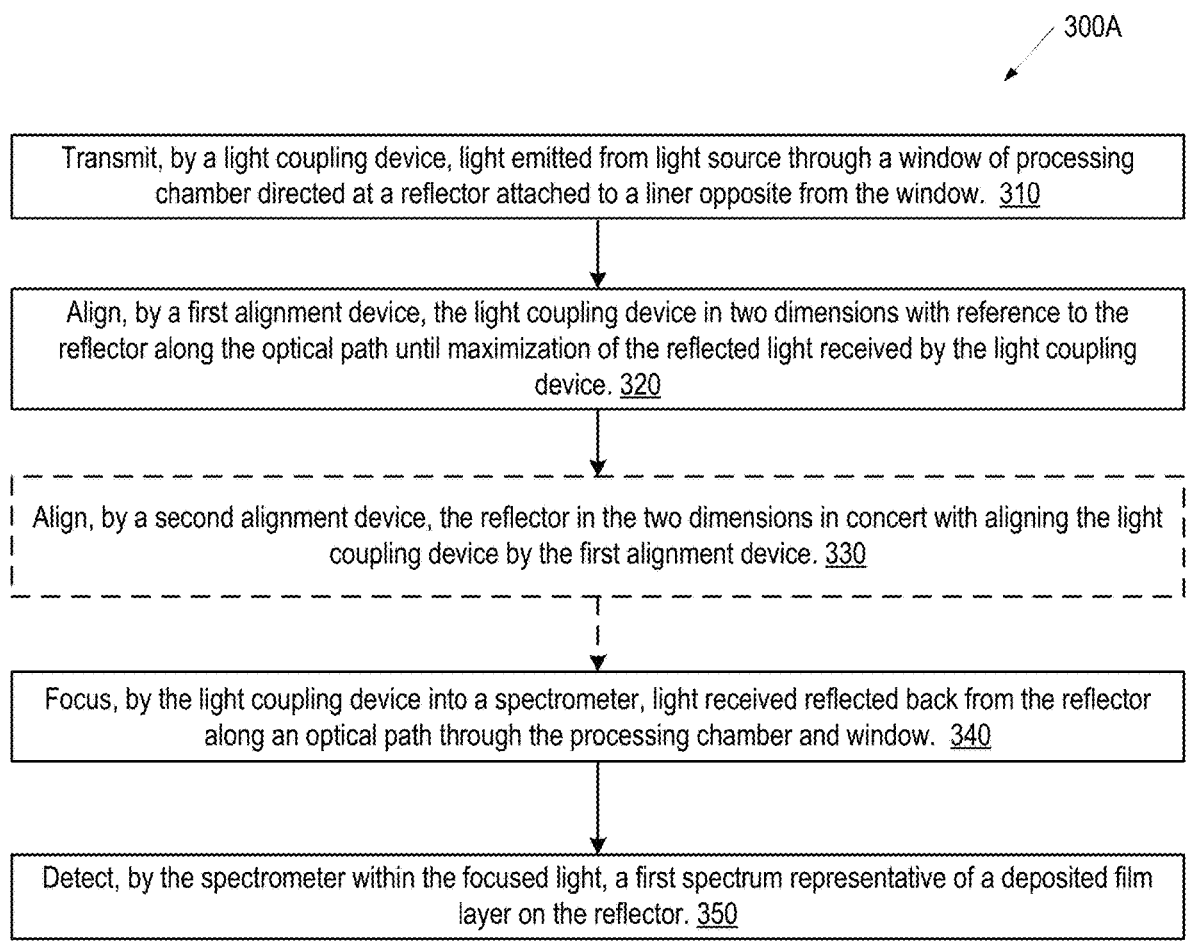
FIG. 3A is a flow chart of a method for measuring a first spectrum of a deposited thin film on a reflector attached to a liner of a processing chamber, according to one aspect of the disclosure.

In one embodiment, an apparatus includes a liner adapted to cover an inner wall of a processing chamber. The apparatus also includes a reflector attached to a first side of the liner, wherein a surface of the reflector has a surface roughness (Ra) of no more than two microinches. Further, the apparatus includes a window formed in a second side of the liner that is opposite from the first side, wherein light passing through the window reflects off of the reflector and back through the window FIG. 3 is a flow chart of a method 300A for measuring a first spectrum of a deposited thin film on a reflector attached to a liner of a processing chamber, according to one aspect of the disclosure. The method 300A may be performed with the components described with reference to FIG. 2, as will be apparent. In various embodiments, the broadband light source 201 may emit light towards the light coupling device 204, e.g., through the fiber optic cable 232. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The method 300A may begin with collimating and transmitting, by the light coupling device 204, the light along an optical path through the window 120, through the processing chamber 103, and onto the reflector 128 attached to the liner 124 opposite from the window 120 (310). The method 300A may continue with aligning, by the first alignment device 208, in two dimensions, the light coupling device 204 with the reflector 128 along the optical path until maximization of the reflected light received by the light coupling device 204 (320).

The method 300A may optionally continue with aligning, by the second alignment device 212, the reflector 128 in concert with alignment of the light coupling device 204, by the first alignment device 208, with the reflector 128 to maximize the reflected light received by the light coupling device 204 (330).

With continued reference to FIGS. 2-3, the method 300A may continue with focusing, by the light coupling device 204 into the spectrometer 225, the light received reflected back from the reflector along the optical path through the processing chamber and the window (340). The light may first be focused into the fiber optic cable 232 before the spectrometer 225 receives the focused light. The method 300 may continue with detecting, by the spectrometer 225, a first spectrum representative of the deposited film layer on the reflector 128 (350).

Figure 3B:
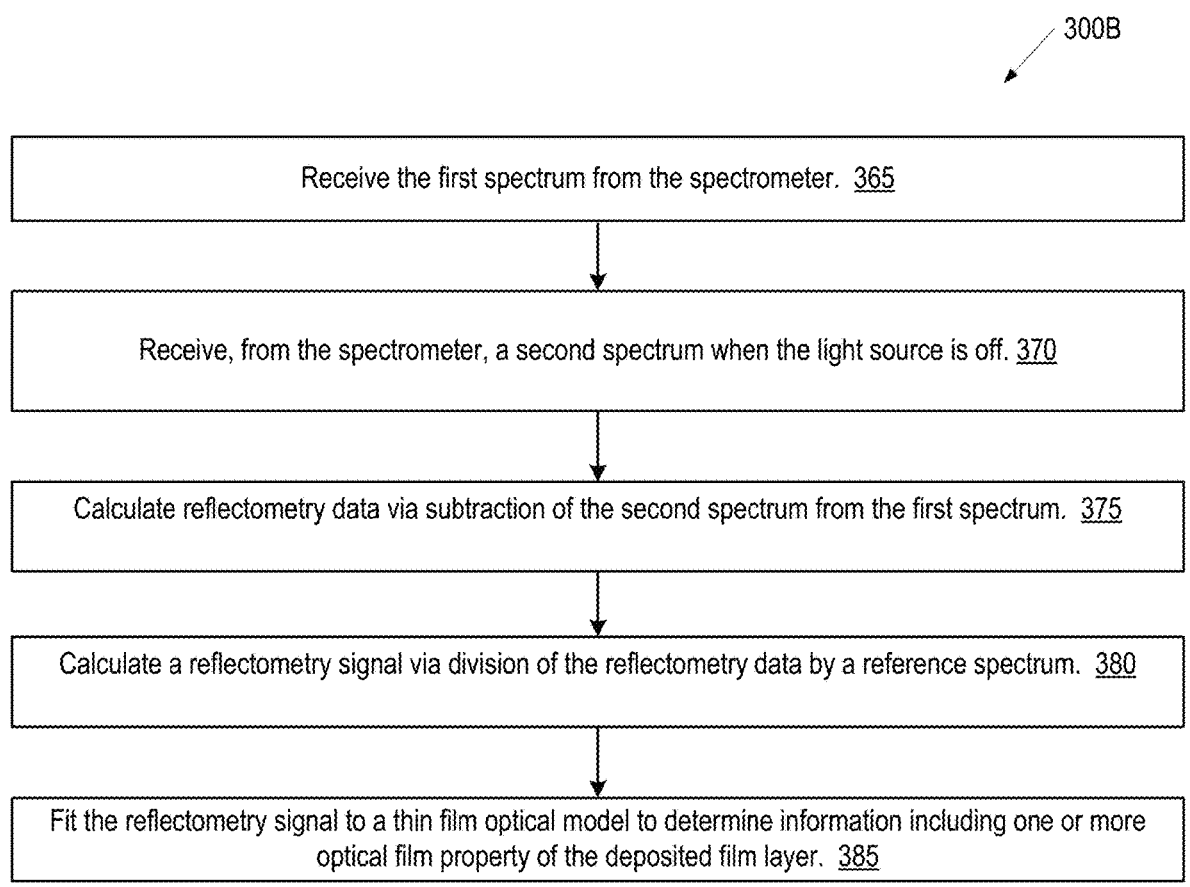
FIG. 3B is a flow chart of a method for measuring a second spectrum (without light on) of the deposited thin film to, together with the first spectrum, determine one or more optical film property of the process film layer, according to an aspect of the disclosure.

FIG. 3B is a flow chart of a method 300B for measuring a second spectrum (without light on) of the deposited thin film to, together with the first spectrum, determine one or more optical film property of the process film layer, according to an aspect of the disclosure. The method 300B may be performed by processing logic that may include hardware (circuitry, dedicated logic, etc.), software (such as is run on a general purpose computer system or a dedicated machine), firmware, or some combination thereof. For example, the method 300B may be performed by the controller 109, e.g., by the processing device 130, as these components are referenced herein. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The method 300B begins with the processing logic receiving, from the spectrometer 225, the first spectrum (365). The method 300B may continue with the processing logic receiving, from the spectrometer 225, a second spectrum when the light source is off (370). The method 300B may further include the processing logic calculating reflectometry data by subtracting (e.g., subtraction of) the second spectrum from the first spectrum (375). The method 300B may continue with the processing logic calculating a reflectometry signal by dividing (e.g., division of) the reflectometry data by a reference spectrum (380). The method 300B may further include the processing logic fitting the reflectometry signal to a thin film optical model to determine information including one or more optical film property of the deposited film layer (385). In some embodiments, the one or more optical thin film property include deposited film thickness as well as the refractive index (n) and extinction coefficient (k) values. The processing logic may determine, using the n and k values, a composition of the deposited film layer.

Figure 4:
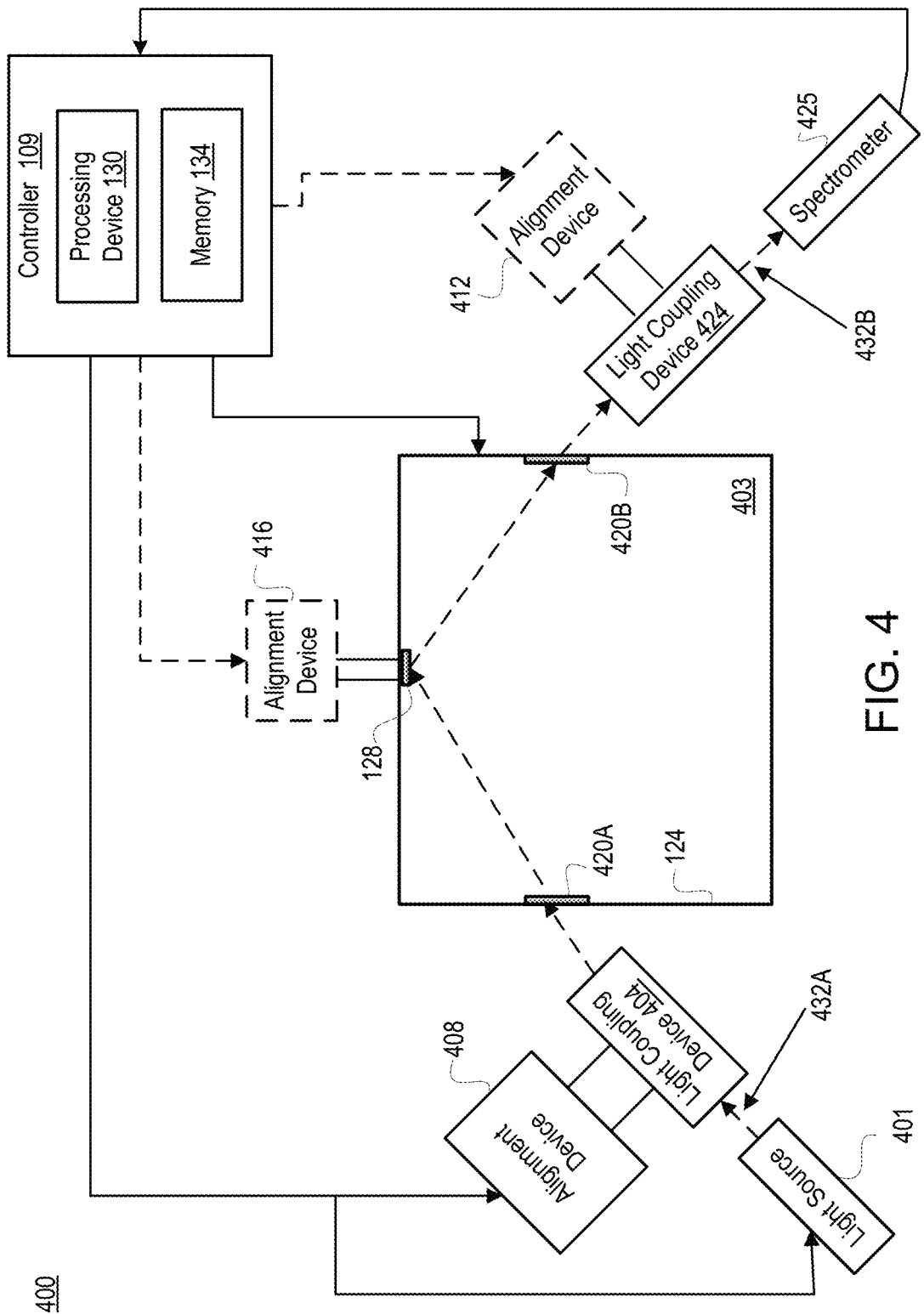
FIG. 4 illustrates a simplified side view of another system for monitoring a processing chamber, according to another aspect of the disclosure.

FIG. 4 illustrates a simplified side view of another system 400 for monitoring a processing chamber, according to another aspect of the disclosure. The system 400 may include, for example, a processing chamber 403 having a first window 420A and a second window 420B, with the reflector 128 attached to or integrated within the liner 124 at a location partway between the first and second windows. Light may shine through the first window 420A and the second window 420B at an oblique angle with respect to the reflector 128.

In various embodiments, the system 400 includes a light source 401 (e.g., a broadband light source), a first light coupling device 404 (e.g., a first collimator) positioned adjacent the first window 420A, and a first alignment device 408 operatively coupled to and for alignment of the first light coupling device 404. The first light coupling device 404 may collimate and direct light (e.g., electromagnetic radiation) through the first window 420A along a first optical path and onto the reflector 128, which produces reflected light. The system 400 may include an fiber optic cable 432A to couple the light source 401 to the light coupling device 404 for enhanced light transfer efficiency as discussed previously.

In the various embodiments, the system 400 may further include a second light coupling device 424 (e.g., a second collimator) positioned adjacent to the second window 420B, a spectrometer 425, and an optional second alignment device 412 operatively coupled to and for alignment of the second light coupling device 424. Reflected light that bounces off the reflector 128 along a second optical path may pass through the second window 420B and enter into the second light coupling device 424, which is to focus the reflected light into the spectrometer 425. The system 400 may include a fiber optic cable 432B to couple the light coupling device 424 to the spectrometer 425 for greater light transfer efficiency, as discussed previously. Thus, the light coupling device 424 may focus the light received reflected back from the reflector 128 into the fiber optic cable 432B, and thus into the spectrometer 425.

The system 400 may optionally further include a third alignment device 416 operatively coupled to and for alignment of the reflector 128. Each alignment device 408, 412, and 416 may be a gimbal, a gyroscope, a Cardan shaft, or the like for imparting two dimensional alignment (e.g., angular compensation) to one of the first light coupling device 404, the second light coupling device 424, and the reflector 128, respectively.

In some embodiments, the spectrometer 425 may be an ellipsometer, and may already exist within the processing system 400 for measuring thin films on substrates. Advantageously, therefore, the ellipsometer (e.g., spectrometer 425) may be selectively realigned to receive focused light from the second light coupling device 424 in the system 400. The functions of these components are discussed in detail with reference to FIGS. 5A-5B.

Further, the controller 109 (e.g., processing device 130) may be coupled to the first alignment device 408, and optionally coupled to the second alignment device 412 and the third alignment device 418. The controller 109 may calibrate or control the alignment device(s) in order to increase the SNR of the collimated light above a threshold SNR. Further, the reflector 128, which may be disk-shaped in one embodiment, may be manufactured and/or polished to have a surface roughness (Ra) of no more than two microinches. Such a highly polished (or smooth) surface may enable not only a better SNR of the reflected light, but also enable true thin film interferometric operations. For example, the processing device 130 may calculate deposited film thickness as well as the refractive index (n) and extinction coefficient (k) values based on the spectra detected by the spectrometer 425. The refractive index is the ratio of the speed of light in a vacuum to the speed of light in the deposited film layer. The extinction coefficient is a measure of how much light is absorbed in the deposited film layer. The spectrometer 425 (or the processing device 130) may determine, using the n and k values, a composition of the deposited film layer.

In disclosed embodiments, the controller 109 may be coupled to the spectrometer 425 and to the light source 401, and be configured to receive spectra-based data (e.g., the first spectrum and the second spectrum), generate an ellipsometry signal, analyze the ellipsometry signal to determine one or more optical film property of the deposited thin film, and send commands to the controller 109 to update a process within the processing chamber based on the analysis. Such updates may include alerts and will be discussed in more detail with reference to FIG. 6.

In one embodiment, an apparatus a liner adapted to cover an inner wall of a processing chamber. The apparatus further includes a reflector attached to a first side of the liner, wherein a surface of the reflector has a surface roughness (Ra) of no more than two microinches. The apparatus further includes a first window formed in a second side of the liner that is adjacent to the first side. The apparatus also includes a second window formed in a third side of the liner that is also adjacent to the first side, wherein light passing through the first window reflects off of the reflector at an oblique angle and out through the second window.

FIG. 5A is a flow chart of a method 500A for measuring a first spectrum of a deposited thin film on a reflector attached to a liner of a processing chamber, according to another aspect of the disclosure. The method 500A may be performed with the components described with reference to FIG. 5A, as will be apparent. In various embodiments, the broadband light source 401 may emit light towards the light coupling device 404, e.g., through the fiber optic cable 432A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The method 500A may begin with collimating and transmitting, by the first light coupling device 404, light emitted from a light source through the first window 420A of the processing chamber 403 directed along a first optical path onto the reflector 128 (mounted on the liner 124) at an oblique angle with respect to the reflector 128 (510). The method 500A may continue with aligning, by the first alignment device 408, in two dimensions, the first collimator with the reflector along the first optical path until maximization of the reflected light received by the second collimator (515).

In various embodiments, the method 500A may optionally continue with aligning, by the second alignment device 412, in two dimensions, the second collimator with reference to the reflector along the second optical path until the maximization of the reflected light received by the second collimator (520). The method 500A may optionally continue with aligning, by the third alignment device 416, the reflector in concert with the first alignment device aligning the first collimator with the reflector and the second alignment device aligning the second collimator with the reflector (525). In one embodiment, the alignment of operations 520 and/or 525 are performed simultaneously with the alignment of operation 515 to maximize the reflected light received by the second collimator, and increase the SNR of the reflected light.

Figure 5B:
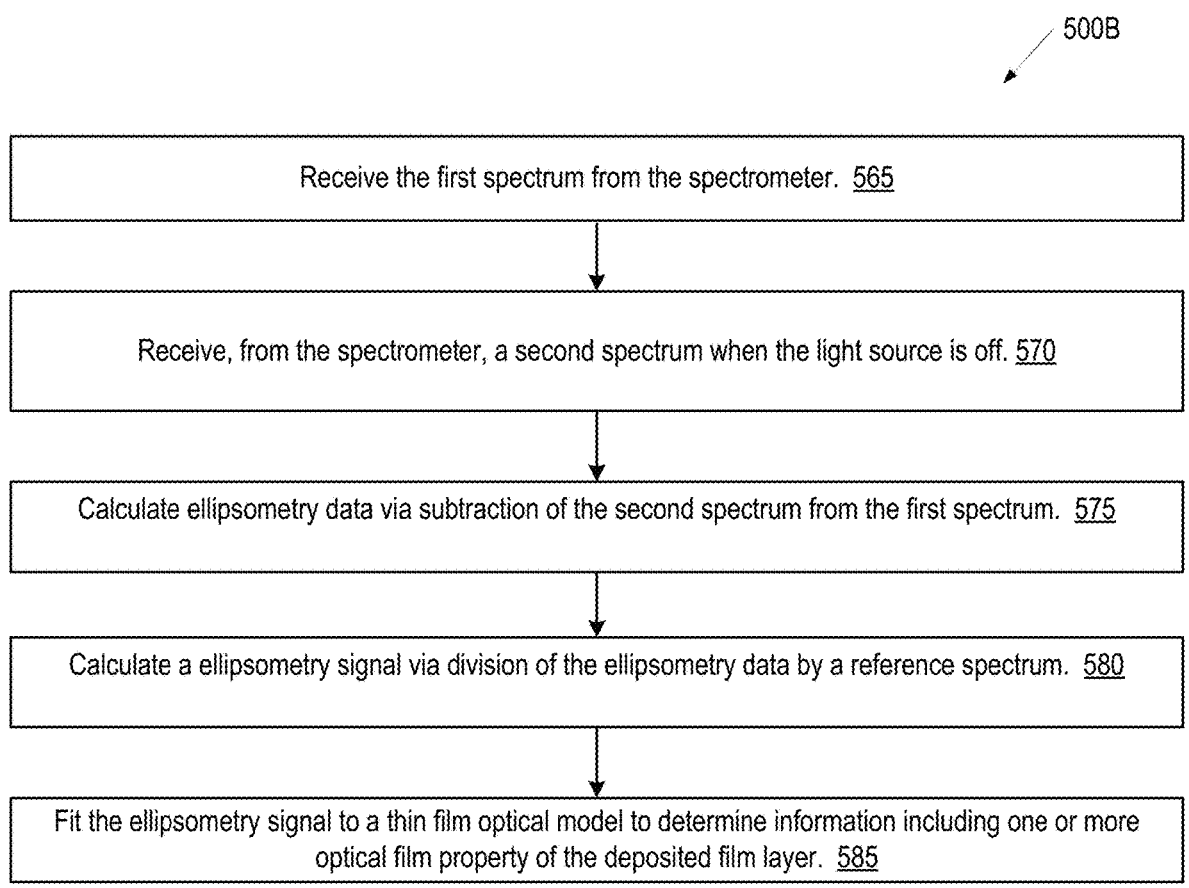
FIG. 5B is a flow chart of a method for measuring a second spectrum (without light on) of the deposited thin film to, together with the first spectrum, determine one or more optical film property of the process film layer, according to an aspect of the disclosure.

With continued reference to FIG. 5A, the method 500A may continue with focusing, by the second light coupling device 424 into a fiber optic cable 432B, the light received reflected back from the reflector 128 along the second optical path through the second window 420B of the processing chamber 403 (530). The method 500 may continue with receiving, by the spectrometer 425, the focused light from the fiber optic cable (535). The method 500 may continue with detecting, by the spectrometer 425 within the focused light, a first spectrum representative of the deposited film layer on the reflector 128 (540). Now that the first spectrum is obtained, the method 500B of FIG. 5B may be performed against in order to likewise determine the one or more optical thin film property of the deposited thin film on the reflector 128.

FIG. 5B is a flow chart of a method for measuring a second spectrum (without light on) of the deposited thin film to, together with the first spectrum, determine one or more optical film property of the process film layer, according to an aspect of the disclosure. The method 500B may be performed by processing logic that may include hardware (circuitry, dedicated logic, etc.), software (such as is run on a general purpose computer system or a dedicated machine), firmware, or some combination thereof. For example, the method 500B may be performed by the controller 109, e.g., by the processing device 130, as these components are referenced herein. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The method 500B begins with the processing logic receiving, from the spectrometer 225, the first spectrum (565). The method 500B may continue with the processing logic receiving, from the spectrometer 225, a second spectrum when the light source is off (570). The method 500B may further include the processing logic calculating ellipsometry data by subtracting (e.g., subtraction of) the second spectrum from the first spectrum (575). The method 500B may continue with the processing logic calculating an ellipsometry signal by dividing (e.g., division of) the ellipsometry data by a reference spectrum (580). The method 500B may further include the processing logic fitting the ellipsometry signal to a thin film optical model to determine information including one or more optical film property of the deposited film layer (585). In some embodiments, the one or more optical thin film property include deposited film thickness as well as the refractive index (n) and extinction coefficient (k) values. The processing logic may determine, using the n and k values, a composition of the deposited film layer.

Figure 6:
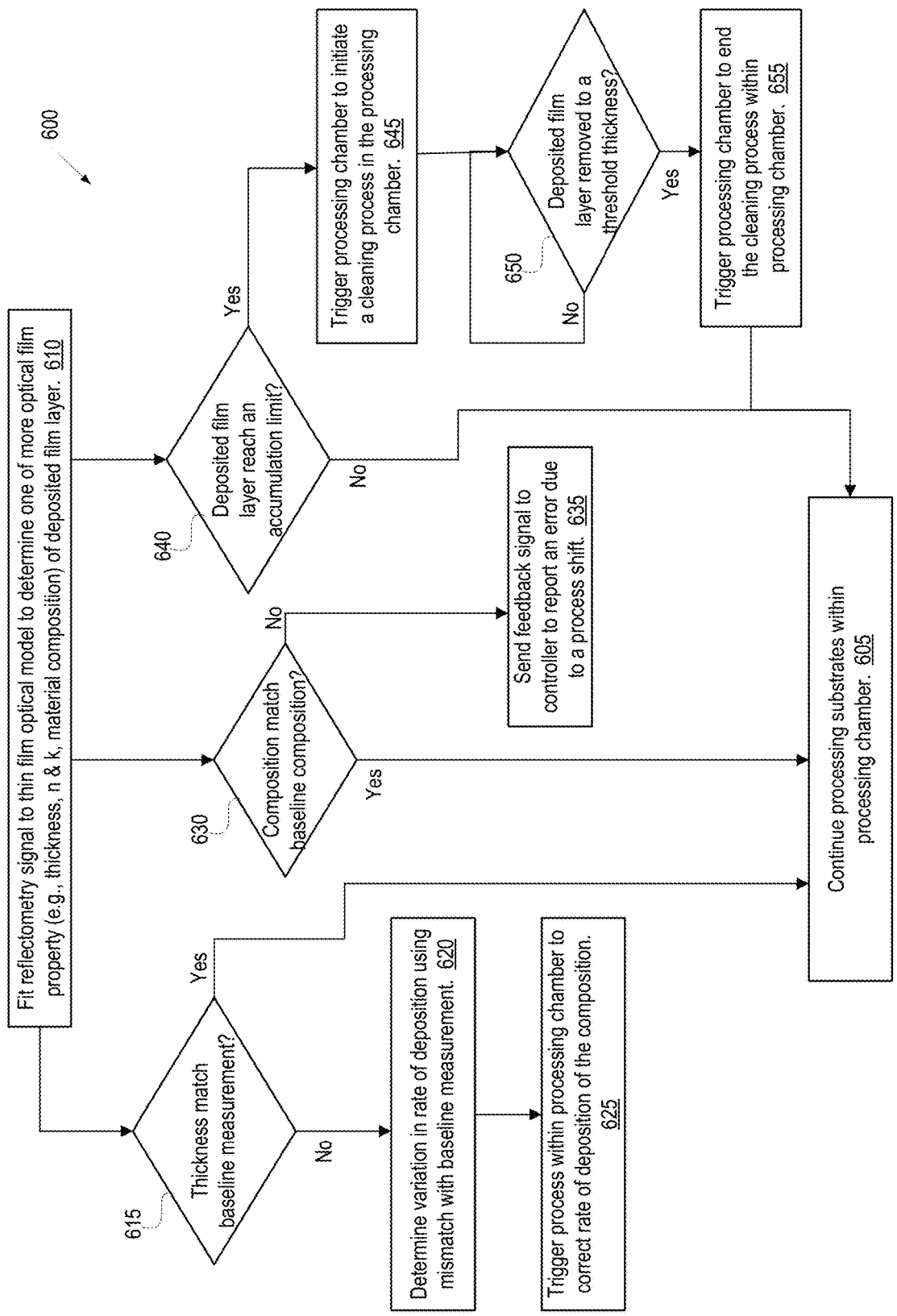
FIG. 6 is a flow chart of methods using one or more optical film property of the deposited thin film on the reflector to improve the processing within the processing chamber, according to various aspects of the disclosure.

FIG. 6 is a flow chart of methods 600 using one of the thickness or the composition of the deposited thin film on the reflector to improve the processing within the processing chamber, according to various aspects of the disclosure. The method 600 may be performed by processing logic that may include hardware (circuitry, dedicated logic, etc.), software (such as is run on a general purpose computer system or a dedicated machine), firmware, or some combination thereof. For example, the method 600 may be performed by the controller 109, e.g., by the processing device 130, as these components are referenced herein. In embodiments, the various baselines or threshold values (such as variations in thickness or for n and k) may be stored and indexed against particular compositions within the memory 134 of the controller 109. These values may be used by way of comparison by the various methods 600 now discussed. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

With reference to FIG. 6, the methods 600 may begin with the processing logic processing a reflectometry signal to fit the reflectometry signal to a thin film optical model to determine one or more optical film property (e.g., thickness, values for n and k, and/or material composition) of the deposited film layer on the reflector (610). When measurements are taken during processing substrates within the processing chamber, the methods 600 may continue with the processing logic determining whether the thickness matches a baseline measurement for the deposited film layer, e.g., given the composition of the deposited thin film on the reflector 128 (615). If yes, there is a match, the methods 600 may continue with processing substrates within the processing chamber (605).

If there is not a match, the methods 600 may continue with the processing logic determining, based on (e.g., in response to) the thickness comparison, that a variation in a rate of deposition of the deposited film layer that is beyond a threshold variation (620). The threshold variation may be sufficient to merit a change in the disposition process. Any such threshold variation may be specific to the application, and may be empirically determined based on how much variation is needed to induce a process shift. Also, the process being monitored may be etch, deposition, or the like. The methods 600 may continue with the processing logic triggering a process within the processing chamber 103 that is to correct the rate of deposition of the deposited film layer (625). This portion of the methods 600 may, in this way, use differential measurements compared to a baseline measurement over time to determine whether processes of the processing chamber have shifted (or drifted) over time.

The methods 600 may similarly continue with the processing logic determining whether the composition identified by the spectrometer matches a baseline composition expected to be deposited on the reflector 128 (630). If yes, there is a match, the methods 600 may continue with processing substrates within the processing chamber (605). If there is not a match, the methods 600 may continue with the processing logic sending a feedback signal to the controller 109 (or other computing device with an interface to processing system operators) to report an error due to a process shift detected within the processing chamber (635). The process shift may be detected in the fact that the detected composition has drifted from the expected composition. This portion of the methods 600 may be performed while the processing system is inactive in one embodiment.

In some embodiments, the methods 600 may continue with the processing device determining, after processing a substrate within the processing chamber, whether the deposited film layer on the reflector 128 has reached an accumulation limit (e.g., limit on accumulated thickness required to be with specification) (640). If not, the methods 600 may continue with processing substrates within the processing chamber (605). If yes, the methods 600 may continue with the processing logic triggering the controller 109 to initiate a cleaning process in the processing chamber 103 (645). This cleaning process may be intended to clean the processing equipment and surfaces of built-up films in order to improve future processing results, and/or to return the processing equipment to a certain specification. The cleaning process may also require a plasma process and thus may also have an OES to subtract off the spectrum determined with the light source on to determine the reflectometry signal.

In various embodiments, the methods 600 may continue with, during such a cleaning process triggered by operation 645, determine whether the deposited film layer has been removed to a predetermined threshold thickness (650). Such a determination may be to check whether the deposited film layer has been sufficiently reduced by the cleaning process. Once the deposited film layer has been removed to or beyond the predetermined threshold thickness, the method 600 may continue with the processing logic triggering the processing chamber to end the cleaning process within the processing chamber (655). Once completed, the method 600 may continue with processing substrates within the processing chamber (605).

Additional or similar methods to the method 600 of FIG. 6 are envisioned. For example, during processing substrates within the processing chamber, the processing logic may detect a moment in time when the deposited film layer has reached a threshold level of thickness on the reflector 128.

The processing logic may trigger an end to the deposition process that is depositing the deposited film layer. The processing logic may make other similar decisions as this to update a process or process state of the processing chamber to improve substrate throughput, quality, and/or reduce produces shift.

According to a further embodiment, the processing chamber may, in some cases, run a cleaning process after every substrate (or group of substrates) processed, or at some other periodicity. The processing logic can accurately determine the moment that the endpoint of this clean is reached on the reflector surface. It can then send a trigger to the processing chamber to stop the clean and proceed to the next step, improving throughput. If the reflector surface does not clean at the same rate as the rest of the chamber, this difference can be characterized beforehand and compensated via a lookup table in the controller 109.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A system comprising:
a reflector attached to a liner of a processing chamber;
a spectrometer;
a light coupling device to:
transmit light, from a light source, through a window of the processing chamber directed at the reflector; and
focus, into the spectrometer, light received reflected back from the reflector along an optical path through the processing chamber and the window;
wherein the spectrometer is to detect, within the focused light, a first spectrum representative of a deposited film layer on the reflector; and
a first alignment device coupled to the light coupling device, the first alignment device to align, in two dimensions, the light coupling device with the reflector until maximization of the light received by the light coupling device.

2. The system of claim 1, wherein the alignment device comprises at least one of a gimbal or a Cardan shaft, the system further comprising a second alignment device coupled to the reflector to align the reflector in concert with alignment of the light coupling device, by the first alignment device, with the reflector.

3. The system of claim 1, wherein a surface of the reflector has a surface roughness (Ra) of no more than two microinches.

4. The system of claim 1, further comprising a processing device coupled to the first alignment device, the processing device to calibrate the first alignment device in order to increase a signal-to-noise ratio (SNR) of the focused light above a threshold SNR.

5. The system of claim 1, further comprising a processing device coupled to the spectrometer, the processing device to:
receive, from the spectrometer, the first spectrum;
receive, from the spectrometer, a second spectrum when the light source is off;
calculate reflectometry data via subtraction of the second spectrum from the first spectrum;
calculate a reflectometry signal via division of the reflectometry data by a reference spectrum; and
fit the reflectometry signal to a thin film optical model to determine information comprising one or more optical film property of the deposited film layer.

6. The system of claim 5, wherein the one or more optical film property comprises thickness, and wherein, during processing substrates within the processing chamber, the processing device is further to:
compare the thickness with a baseline measurement for the deposited film layer;
determine, using the comparison, a variation in a rate of deposition of the deposited film layer that is beyond a threshold variation; and
trigger a process within the processing chamber that is to correct the rate of deposition of the deposited film layer.

7. The system of claim 5, wherein the one or more optical film property comprises thickness, and wherein, after processing a substrate within the processing chamber, the processing device is further to:
detect a moment in time at which the deposited film layer on the reflector has been removed within a predetermined threshold thickness; and
in response to the detection, trigger a controller of the processing chamber to end a cleaning process within the processing chamber.

8. The system of claim 5, wherein the one or more optical film property comprises thickness, and wherein, during processing substrates within the processing chamber, the processing device is further to:
detect a moment in time when the deposited film layer has reached a threshold level of thickness on the reflector; and
transmit a feedback signal to a controller of the processing chamber to end a deposition process that is depositing the deposited film layer.

9. A system comprising:
a reflector attached to a liner of a processing chamber;

a light source to emit light;

a first collimator coupled to the light source and positioned to collimate and direct the light through a first window of the processing chamber onto the reflector at an oblique angle;

a spectrometer;

a second collimator positioned adjacent a second window on a side of the processing chamber across from the first window, wherein the second collimator is to focus light received from the reflector into a fiber optic cable;

wherein the spectrometer is to receive the focused light from the fiber optic cable and detect, within the focused light, a first spectrum representative of a deposited film layer on the reflector; and a first alignment device coupled to the first collimator, the first alignment device to align, in two dimensions, the first collimator with the reflector until maximization of the light received by the second collimator.

10. The system of claim 9, further comprising:

a second alignment device coupled to the second collimator to align, in two dimensions, the second collimator with reference to the reflector until the maximization of the light received by the second collimator; and a third alignment device coupled to the reflector to align the reflector in concert with the aligning, by the first alignment device, of the first collimator with the reflector and aligning, by the second alignment device, of the second collimator with the reflector.

11. The system of claim 9, wherein the reflector is positioned within the processing chamber at a location partway between the first window and the second window and has a surface roughness (Ra) of no more than two microinches.

12. The system of claim 9, further comprising a processing device coupled to the spectrometer, the processing device to:

receive, from the spectrometer, the first spectrum;

receive, from the spectrometer, a second spectrum when the light source is off;

calculate a ellipsometry data via subtraction of the second spectrum from the first spectrum;

calculate an ellipsometry signal via division of the ellipsometry data by a reference spectrum; and fit the ellipsometry signal to a thin film optical model to determine information comprising one or more optical film property of the deposited film layer.

13. The system of claim 12, wherein the one or more optical film property comprises thickness, and wherein, during processing substrates within the processing chamber, the processing device is further to:

compare the thickness with a baseline measurement for the deposited film layer;

determine, using the comparison, a variation in a rate of deposition of the deposited film layer that is beyond a threshold variation; and to trigger a process within the processing chamber that is to correct the rate of deposition of the deposited film layer.

14. The system of claim 12, wherein the one or more optical film property comprises thickness, and wherein, during processing substrates within the processing chamber the processing device is further to:

detect a moment in time when the deposited film layer has reached a threshold level of thickness on the reflector; and trigger an end of a deposition process that is depositing the deposited film layer.

15. The system of claim 12, wherein the one or more optical film property comprises thickness, and wherein, after processing a substrate within the processing chamber, the processing device is further to:

detect that the thickness of the deposited film layer on the reflector has reached an accumulation limit; and in response to the detection, trigger the processing chamber to initiate a cleaning process in the processing chamber.

16. The system of claim 15, wherein the one or more optical film property comprises thickness, and wherein, after processing a substrate within the processing chamber and during a cleaning process, the processing device is further to:

detect a moment in time at which the deposited film layer on the reflector has been removed within a predetermined threshold thickness; and in response to the detection, trigger the processing chamber to end the cleaning process within the processing chamber.

* * * * *